(12) United States Patent
Luo et al.

(10) Patent No.: US 10,802,518 B1
(45) Date of Patent: Oct. 13, 2020

(54) POWER STAGE WITH VERTICAL INTEGRATION FOR HIGH-DENSITY, LOW-NOISE VOLTAGE REGULATORS

(71) Applicant: Dell Products, L.P., Round Rock, TX (US)

(72) Inventors: Shiguo Luo, Austin, TX (US); Wu Feng-Yu, Taipei (TW)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/512,719

(22) Filed: Jul. 16, 2019

(51) Int. Cl.
*H02M 3/158* (2006.01)
*G05F 1/46* (2006.01)
*H01L 23/31* (2006.01)
*H01G 4/30* (2006.01)
*H02M 1/32* (2007.01)

(52) U.S. Cl.
CPC .............. *G05F 1/467* (2013.01); *H01G 4/30* (2013.01); *H01L 23/3114* (2013.01); *H02M 3/158* (2013.01); *H02M 2001/327* (2013.01)

(58) Field of Classification Search
CPC . G05F 1/46; G05F 1/462; G05F 1/467; G05F 1/56; G05F 1/19; G05F 1/595; H02M 3/156; H02M 3/1566; H02M 3/158; H02M 2001/327; H01L 23/31; H01L 23/3107; H01L 23/3114; H01G 4/30
See application file for complete search history.

(56) References Cited

U.S. PATENT DOCUMENTS

| | | | | |
|---|---|---|---|---|
| 8,063,619 B2* | 11/2011 | Zhu | ........................... | H02J 7/32 323/266 |
| 9,678,555 B2 | 6/2017 | Luo et al. | | |
| 9,787,172 B2 | 10/2017 | Luo et al. | | |
| 2005/0162021 A1* | 7/2005 | Jenkins | ............... | H02M 3/3376 307/134 |
| 2012/0049826 A1* | 3/2012 | Hsu | ..................... | H02M 3/1588 323/284 |
| 2015/0372597 A1* | 12/2015 | Luo | ..................... | H02M 3/1584 323/271 |

* cited by examiner

*Primary Examiner* — Matthew V Nguyen
(74) *Attorney, Agent, or Firm* — Fogarty LLP

(57) ABSTRACT

Embodiments of a power stage with vertical integration for high-density, low-noise voltage regulators are described. In some embodiments, an Information Handling System (IHS) may include: a processor; and a multi-phase voltage regulator (VR) coupled to the processor, where the multi-phase VR comprises at least one power stage, and where the at least one power stage includes: a High-Side Field-Effect Transistor (HSFET) die mounted on a leadframe; a Low-Side FET (LSFET) die mounted on the leadframe; at least one decoupling capacitor mounted on the leadframe; and a driver circuit mounted on a clip, where the clip overlays at least a portion of the HSFET die and the LSFET die.

13 Claims, 7 Drawing Sheets

POWER STAGE WITH VERTICAL INTEGRATION FOR HIGH-DENSITY, LOW-NOISE VOLTAGE REGULATORS

FIELD

The present disclosure generally relates to electronics, and, more particularly, to a power stage with vertical integration for high-density, low-noise voltage regulators.

BACKGROUND

As the value and use of information continue to increase, individuals and businesses seek additional ways to process and store it. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs employ direct-current-to-direct-current (DC-DC) voltage regulators (VRs) to provide regulated voltages to a number of internal IHS components, such as Central Processing Units (CPUs) and memories. VRs are typically designed considering the power requirements of the CPUs expected to be installed in the IHS. In some cases, a VR may have a plurality of power stages that work together to form a multi-phase VR. The number of phases of a VR can be selected depending upon the power requirements of the IHS.

The inventors hereof have recognized that, with the growing demand for more power (e.g., 500 A peak current), more VR phases are needed. However, having more VR phases requires that more signal traces be routed in the IHS's Printed Circuit Board (PCB), and in most IHS designs, the available PCB space reserved for VRs is already very small. It would also be desirable to shorten the distance between the VR and the powered components CPU in order to reduce losses.

In addition, the inventors have determined that, despite the recent improvements in metal-oxide-semiconductor field-effect transistor (MOSFET) technology that enable high-efficiency VR designs, these VRs are still subject to excessive voltage spikes due to parasitic inductance and fast currents during switching operations. Such VR switching noise reduces the signal integrity of high-speed signal traces, and can lead to MOSFET avalanche, which impacts IHS robustness and lifetime reliability.

To address these, and other concerns, the inventors hereof have developed a new power stage with vertical integration that is particularly well suited for high-density, low-noise VR applications.

SUMMARY

Embodiments of a power stage with vertical integration for high-density, low-noise voltage regulators (VRs) are described. In an illustrative, non-limiting embodiment, an Information Handling System (IHS) may include: a processor; and a multi-phase VR coupled to the processor, where the multi-phase VR comprises at least one power stage, and where the at least one power stage comprises: a High-Side Field-Effect Transistor (HSFET) die mounted on a leadframe; a Low-Side FET (LSFET) die mounted on the leadframe; at least one decoupling capacitor mounted on the leadframe; and a driver circuit mounted on a clip, where the clip overlays at least a portion of the HSFET die and the LSFET die.

In some cases, the at least one decoupling capacitor may include a Multilayer Ceramic Capacitor (MLCC). The clip may include a trace configured to couple a source terminal of the HSFET die to a drain terminal of the LSFET die to form a phase node. Additionally, or alternatively, the clip may cover the LSFET die and the HSFET die to the exclusion of the decoupling capacitor. Additionally, or alternatively, the HSFET die, the LSFET die, the decoupling capacitor, and the driver circuit may be integrated in a Power Quad Flat No Leads (PQFN) package.

The multi-phase VR further may include a VR controller coupled to the at least one power stage. Additionally, or alternatively, the VR controller is coupled to a first pin of the PQFN package, and where the first pin may be configured to: provide the VR controller with an identification of a supplier of the power stage with a selected voltage level; provide the VR controller with access to an HSFET gate terminal; and enable communications during operation of the power stage. Additionally, or alternatively, the first pin may be configured to receive a current reference from the VR controller.

The VR controller may be coupled to a second pin of the PQFN package, and the second pin may be configured to: enable temperature sensing by the VR controller; and provide a fault warning to the VR controller. Also, the multi-phase VR further may include a plurality of power stages disposed next to each other, where the power stages share a common power via and decoupling capacitors.

In another illustrative, non-limiting embodiment, a multi-phase VR may include: a VR controller; and at least one power stage coupled to the VR controller, where the at least one power stage comprises: a HSFET die mounted on a leadframe; an LSFET die mounted on the leadframe; a decoupling capacitor mounted on the leadframe; and a driver circuit mounted on a clip, where the clip overlays at least a portion of the HSFET die and the LSFET die to the exclusion of the decoupling capacitor, and where the HSFET die, the LSFET die, the decoupling capacitor, and the driver circuit are integrated in a package.

In some cases, the decoupling capacitor may include an MLCC. The clip may include a trace configured to couple a source terminal of the HSFET die to a drain terminal of the LSFET die to form a phase node. The VR controller may be coupled to a first pin of the package, and the first pin may be configured to: provide the VR controller with an identification of the power stage; provide the VR controller with access to an HSFET gate terminal; and enable communications during operation of the power stage.

The VR controller may be coupled to a second pin of the PQFN package, and the second pin may be configured to: receive a current reference from the VR controller; and enable communications before operation of the power stage. The VR controller may be coupled to a third pin of the PQFN package, and the third pin may be configured to: enable temperature sensing by the VR controller; and provide a fault warning to the VR controller.

In yet another illustrative, non-limiting embodiment, a power stage of a may include: an HSFET die mounted on a leadframe; an LSFET die mounted on the leadframe; a decoupling capacitor mounted on the leadframe; and a driver circuit mounted on a clip, wherein the clip overlays at least a portion of the HSFET die and the LSFET die to the exclusion of the decoupling capacitor, and where the HSFET die, the LSFET die, the decoupling capacitor, and the driver circuit are integrated in a package.

In some cases, the package may include a first pin configured to: provide an identification of the power stage; provide access to an HSFET gate terminal; and enable communications during operation of the power stage. The package may also include a second pin configured to: receive a current reference; and enable communications before operation of the power stage. The package may further include a third pin configured to: enable temperature sensing; and provide a fault warning to the VR controller.

BRIEF DESCRIPTION OF THE DRAWINGS

The present invention(s) is/are illustrated by way of example and is/are not limited by the accompanying figures. Elements in the figures are illustrated for simplicity and clarity, and have not necessarily been drawn to scale.

DETAILED DESCRIPTION

For purposes of this disclosure, an Information Handling System (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

Embodiments described herein disclose a power stage with vertical integration that is particularly suitable for use in high-density, low-noise voltage regulators (VRs). In various applications, such a VR may power a CPU, memory, or any other component of an IHS. In addition to vertical integration, a power stage as described herein may include decoupling capacitors disposed in a single package with a unique pin/terminal definition.

Figure 1A:
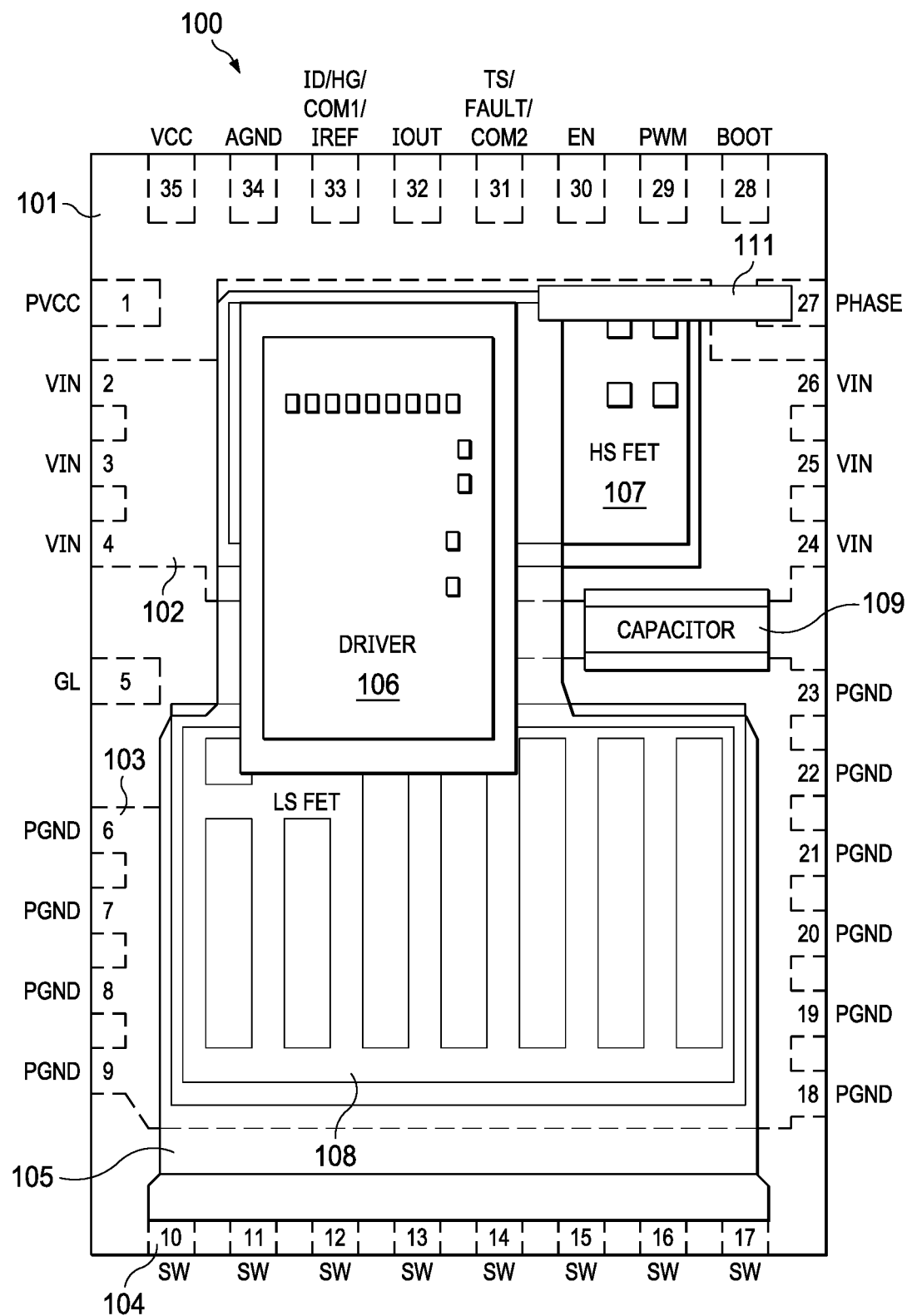
FIG. 1A illustrates a top view of an example of a vertically-integrated power stage for a high-density, low-noise voltage regulator (VR), according to some embodiments.

FIG. 1A illustrates a top view of an example of a vertically-integrated power stage 100 for a high-density, low-noise VR. In this embodiment, power stage 100 includes High-Side Field-Effect Transistor (HSFET) die 107 mounted on first portion 102 of a lead frame, and Low-Side FET (LSFET) die 108 mounted on second portion 103 of the lead frame. Power stage 100 also includes at least one decoupling capacitor 109 bridging a gap between the first and second portions 102/103 of the lead frame.

For example, decoupling capacitor 109 may include a Multilayer Ceramic Capacitor (MLCC), or the like. A first terminal of decoupling capacitor 109 may be coupled to first portion 102 of the lead frame, and a second terminal of decoupling capacitor 109 may be coupled to second portion 103 of the lead frame. In various embodiments, decoupling capacitor 109 may comprise a single 0402-size MLCC capacitor, two 0201-size MLCC capacitors, an integrated silicon capacitor, or the like.

Power stage 100 further includes driver circuit 106 mounted on clip 105. Clip 105 is mounted on the lead frame, overlays at least a portion of HSFET die 107 and LSFET die 108, and it may include trace(s) configured to couple source terminal(s) of HSFET die 107 to drain terminal(s) of the LSFET die 108 to form a phase node. In some cases, clip 105 may leave decoupling capacitor 109 uncovered.

Elements 102-109 may be mounted using wire bonding techniques, for example, and moulded into a single package 101 having leads, pins, or terminals 1-35. For instance, elements 102-108 may be integrated in a Power Quad Flat No Leads (PQFN) package, or the like. Each of pins 1-35 typically provides a single function (e.g., VIN, PGND, etc.), but in some embodiments discussed herein, one or more pins may be multi-function pins. The base of clip 105 is mounted on switching output (SW) pins 104.

As shown in FIG. 1A, both high-side and low-side MOSFET dies 107 and 108 are placed down to lead frame 102/103, and one or more decoupling capacitors 109 are integrated in package 101 underneath clip 105. MLCC package 109 may be of different sizes, still uncovered by clip 105.

Integrated capacitor 109 is put on the same side as dies 107/108, and a reverse geometry reduces the total loop ESL to improve decoupling effectiveness for the input power loop from $V_{in}$ to ground. Driver IC 106 is mounted on the top of clip 105 above HSFET area 107 so that all of signal pins can be reached, for example, by wire bonding. In addition, temperature sensing and compensation become easier because the temperatures for all three dies HSFET 107, LSFET 108, and driver IC 106 are close enough due to low thermal impedance, using a large contact area clip interface. With package 101, thermal pad areas for $V_{in}$ (HSFET drain) and PGND (LSFET source) are maximized with improved thermal capability.

Figure 1B:
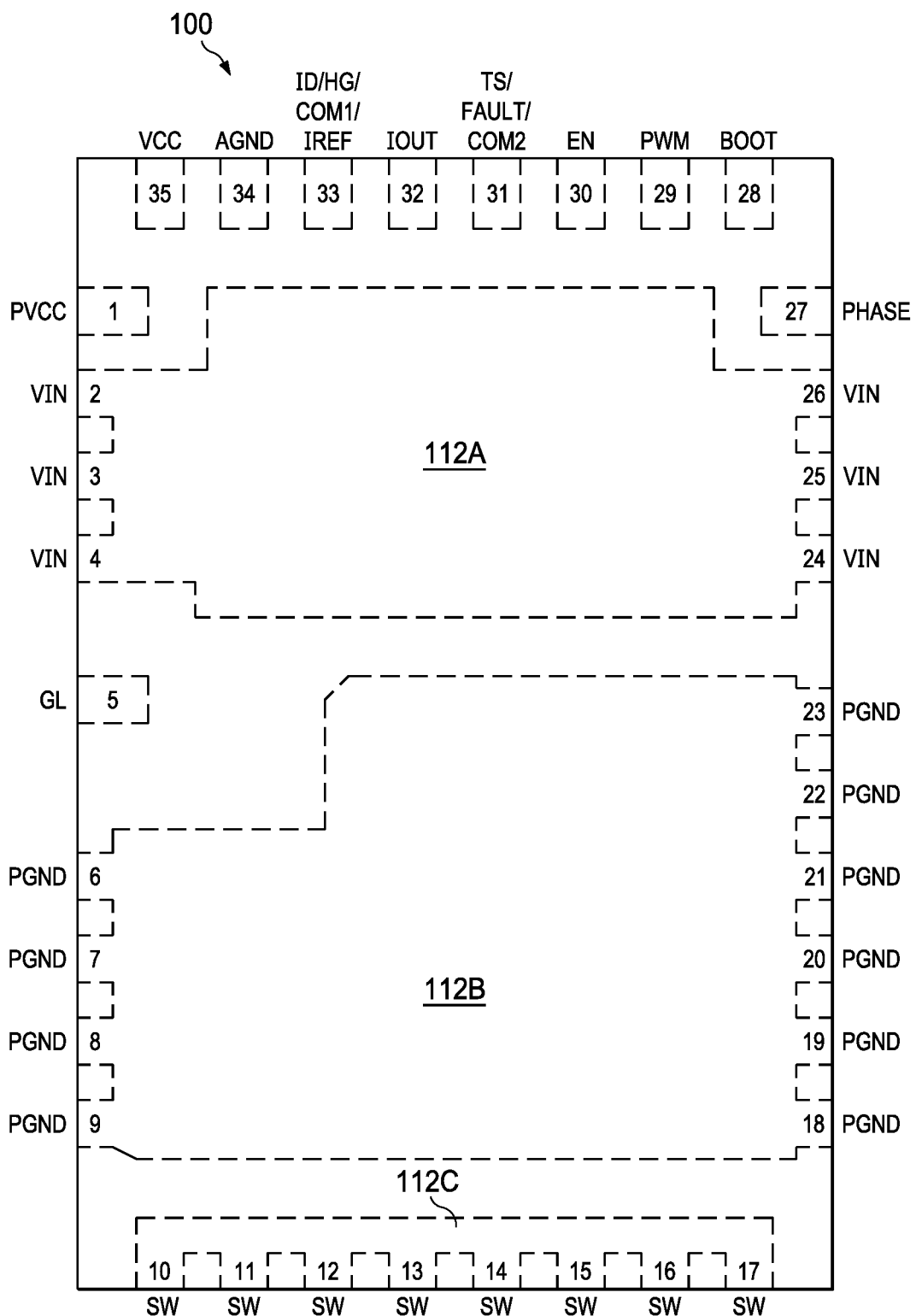
FIG. 1B illustrates an example footprint of a vertically-integrated power stage for a high-density, low-noise VR, according to some embodiments.

FIG. 1B illustrates an example footprint of vertically-integrated power stage 100 for a high-density, low-noise VR. In various embodiments, pins 1-35 may be described as in Table I below. Moreover, terminals 2-4 and 24-26 may be coupled to each other via conductive pad 112A, terminals 6-9 and 18-23 may be coupled to each other via conductive pad 112B, and terminals 10-17 may be coupled to each other via conductive pad 112C. Although used here as a non-limiting example, this particular layout provides significant advantages, as described in more detail below.

TABLE I

Pin Assignments

| # | Name | Pin Type | Pin Operation | Description and Application Notes |
|---|---|---|---|---|
| 1 | PVCC | Power | FET gate supply voltage | Supply low/high side FET drivers. |
| 2-4 | Vin | Power | Input voltage | Input source for power train. |
| 5 | GL | O | Low-side FET gate monitor | For measurement purpose in Pstage. |
| 6-9 | PGND | GND | Power ground | GND return for FET driver PVCC supply voltage and power train return path. |
| 10-17 | SW | O | Switch node output | These terminals are connected to inductor through the closest path. |
| 18-23 | PGND | GND | Power ground | All of these GND pins may be connected to Power GND plane through many strong vias. |
| 24-26 | Vin | Power | Input voltage | Input source for power train. |
| 27 | PHASE | I | Switch node sensing and HG return | This pin may be connected to internal SW node for bootstrap branch. |
| 28 | BOOT | I | Bootstrap capacitor connection | The bootstrap capacitor supplies the charge to turn on HS FET; The bootstrap diode is integrated internally, and a ceramic cap may be connected from this pin to phase pin. |
| 29 | PWM | I | PWM signal input | PWM input in either 3.3 V or 5 V logic level from the controller. The logic level could be Hi, Low or tri-stated. High input impedance is expected. |
| 30 | EN | I | Enable pin | Enable pin with 2-level logic. |
| 31 | TS/Fault | O | Temperature monitoring/ Thermal fault | Temperature reporting and fault signaling by logic "H". |
| 32 | IOUT | O | Phase current sensing | Also called called Imon, provides a real-time voltage or current proportional to the low-side FET currents. |
| 33 | ID/IREF | O | Pstage Supplier ID | Each supplier may be assigned a voltage level to represent its ID, which will be used to distinguish supplier's Pstages. As such, VR may be further optimized through 2nd time fine tuning by digital controller. IREF is the reference of using voltage source Imon output. |
| 34 | AGND | GND | Control signal ground | This pin may be connected to power ground plane by single point as reference of signals. |
| 35 | VCC | Power | Control supply voltage | Supply internal noise-sensitive control circuits. |

Figure 2:
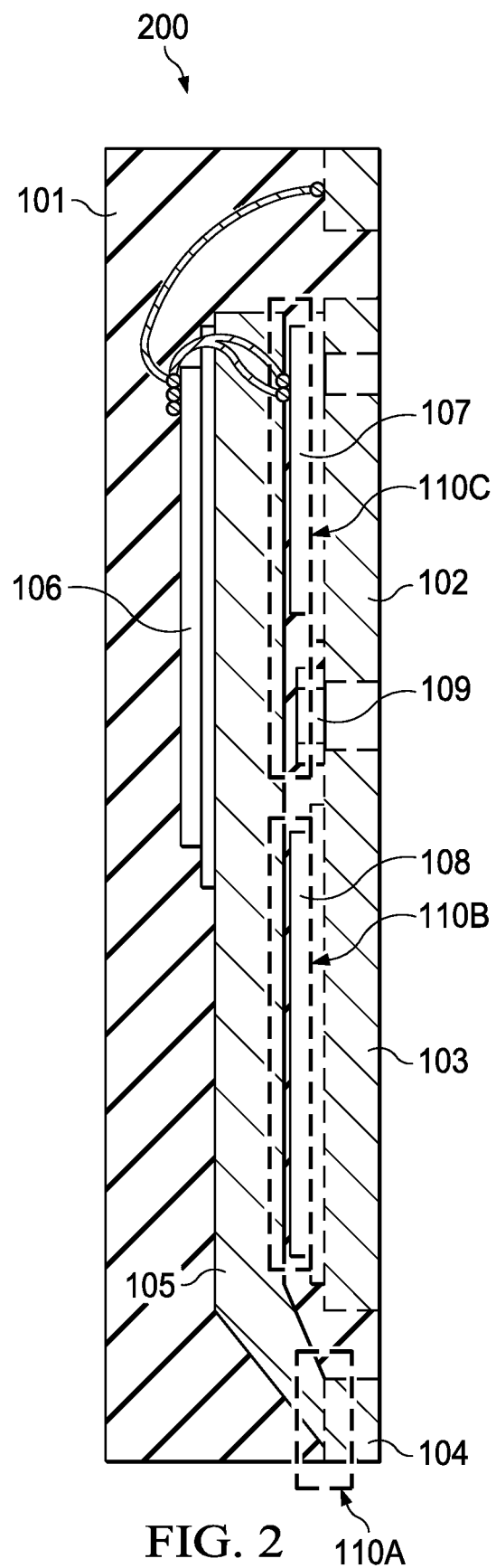
FIG. 2 illustrates a cross-sectional view of an example of a vertically-integrated power stage, according to some embodiments.

FIG. 2 illustrates a cross-sectional view 200 of an example of the vertically-integrated power stage 100 shown in FIG. 1. Particularly, view 200 shows HSFET die 107, LSFET die 108, and decoupling capacitor 109 mounted on lead frame 102/103, as well as driver circuit 106 mounted on clip 105, integrated in package 101. As shown, clip 105 is mounted on three parts: HSFET 107, LSFET 108 and SW pins 104. For example, clip 105 may be etched to different heights for connecting to three locations 110A-C. In various implementations, PHASE and SW pins may be equipotential with coupling 111, such that clip 105 is coupled to four locations. As a result, in some cases, power stage 100 may have a reduced size of about 6 mm×4 mm, or 5 mm×4 mm, compared with conventional power stages that are not vertically integrated.

Figure 3:
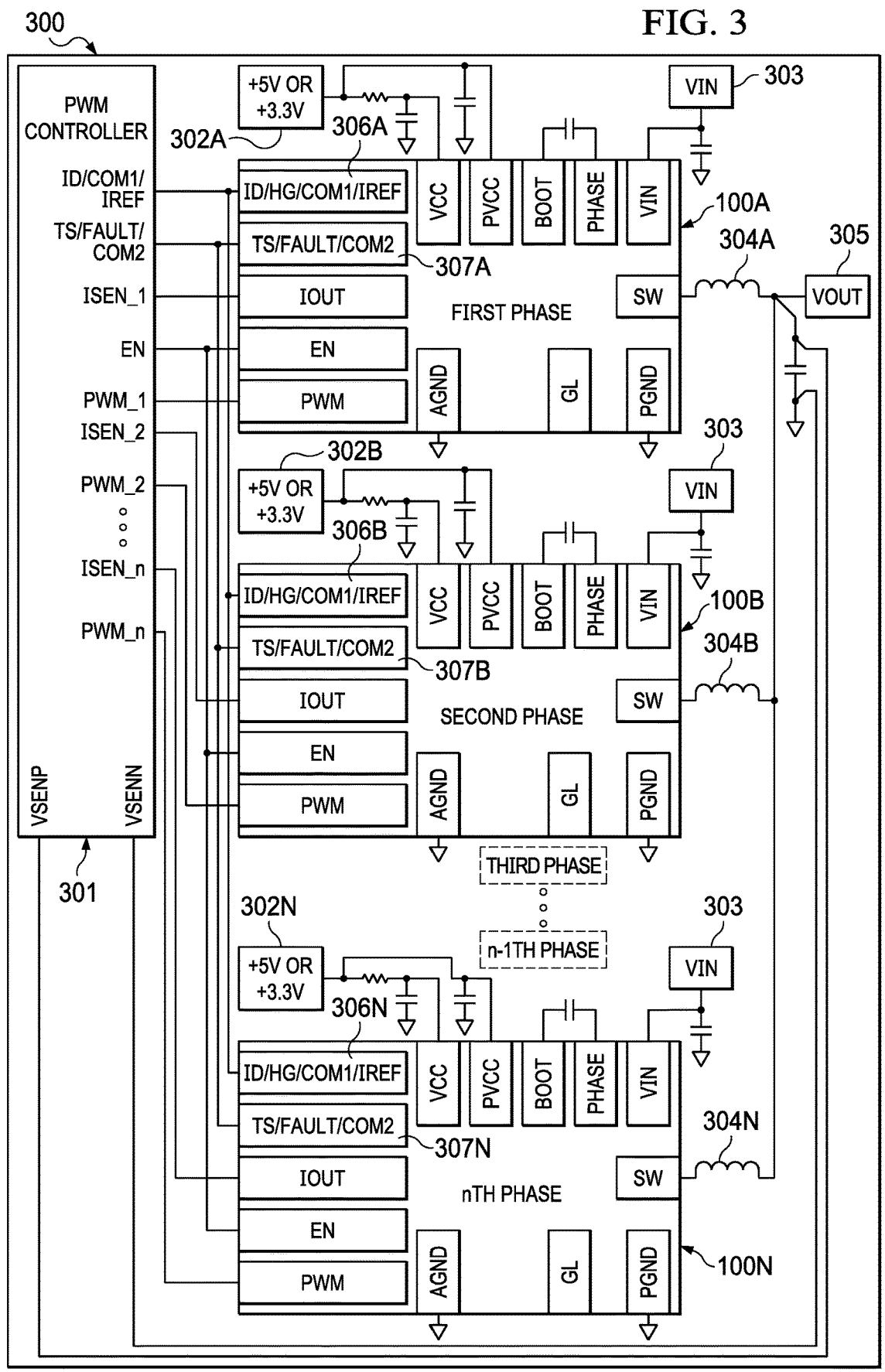
FIG. 3 illustrates a circuit diagram of a VR having multiple, vertically-integrated power stages, according to some embodiments.

FIG. 3 illustrates a circuit diagram of VR 300 having multiple, vertically-integrated power stages 100A-N, according to some embodiments. As illustrated, VR controller 301 is coupled to various pins of each of power stages 100A-N. Each of power stages 100A-N is coupled to a respective voltage source 302A-N (e.g., 5 V or 3.3 V) through one or more capacitors and/or resistors, and to un-regulated input voltage $V_{in}$ 303. Moreover, each of power stages 100A-N has its SW pins coupled to regulated output terminal $V_{out}$ of VR 300 via a plurality of inductors 304A-N.

In some cases, VR controller 301 may be implemented as a Pulse Width Modulation (PWM) controller, or the like. Moreover, one or more pins of VR controller may be coupled to multi-function pins on each of power stages 100A-N. For example, multi-function pin 306A of power stage 100A may be configured to provide VR controller 301 with an identification of the power stage 100A (e.g., a series of bits that indicate a vendor ID), and to provide VR controller 301 with access to an HSFET die (of power stage 100A) gate, which is needed to qualify driver IC 105 during a development phase, but is no longer be needed after qualification. Multi-function pin 306A may also enable communications during operation of power stage 100A.

In some cases, multi-function pin 306A may further be used to provide a current reference (IREF) to power stage 100A. In other cases, however, a different pin may be used to receive a current reference from the VR controller, and to enable communications before operation of the power stage.

Meanwhile, multi-function pin 307A of power stage 100A may be used to enable temperature sensing by VR controller 301, to provide a fault warning to VR controller 301, and/or to enable other phase-to-controller communications.

Figure 4:
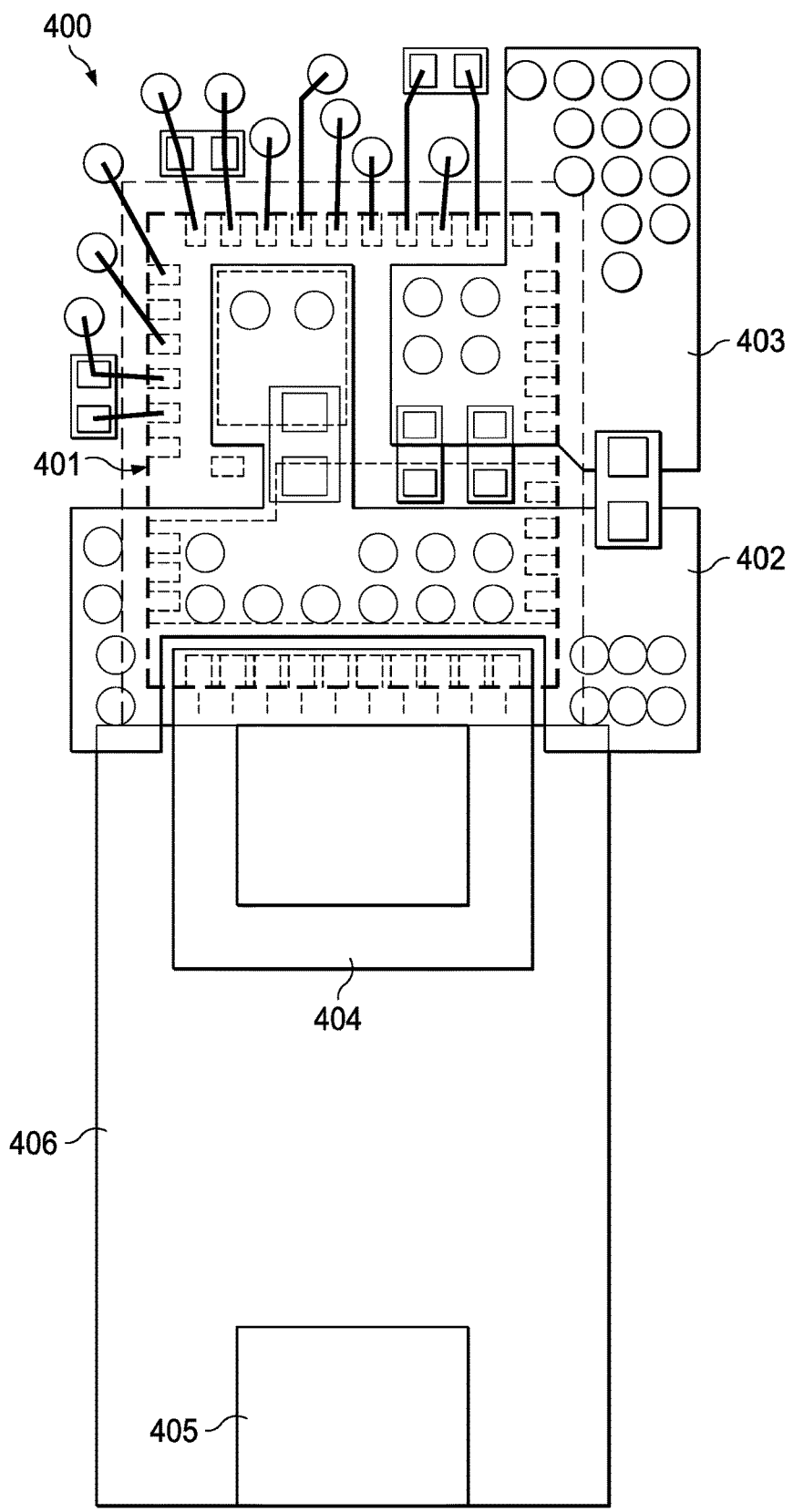
FIG. 4 illustrates a conventional power stage layout.
Figure 5:
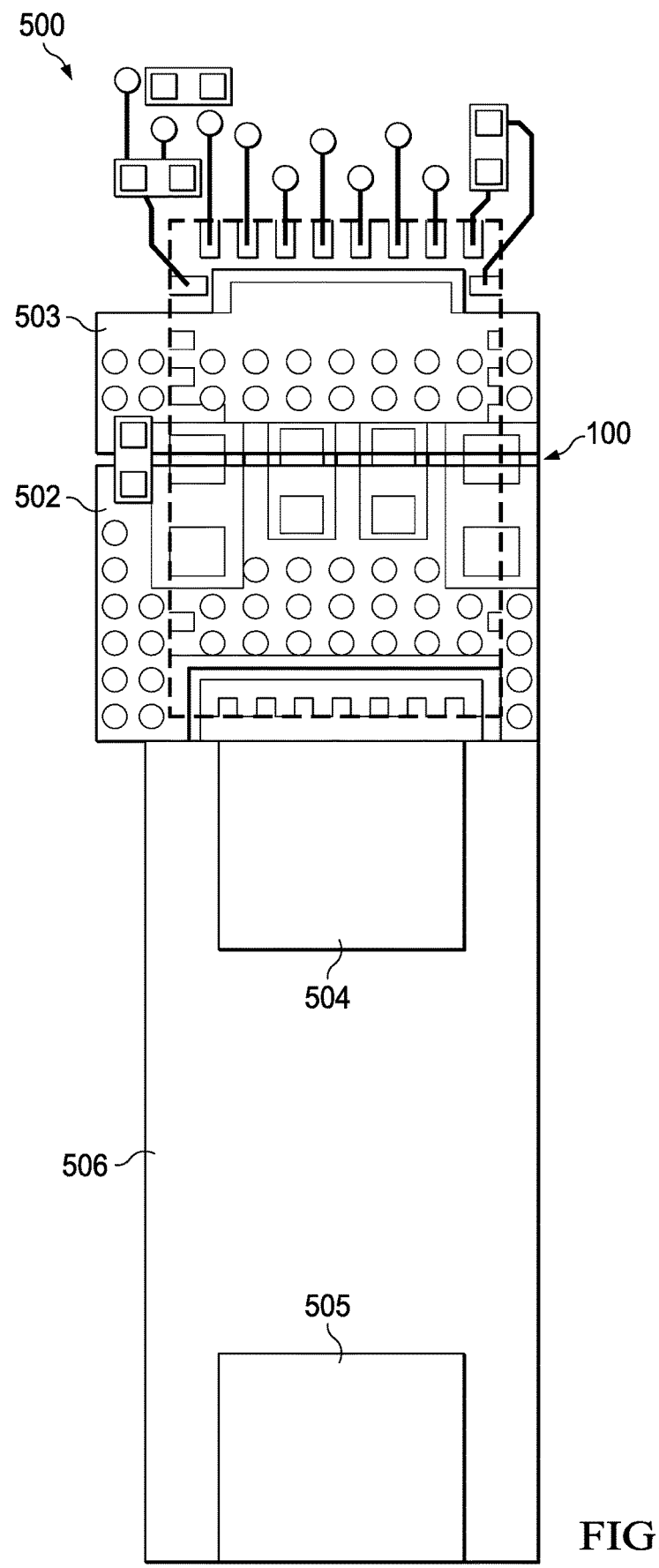
FIG. 5 illustrates a vertically-integrated power stage layout according to some embodiments.

FIG. 4 illustrates a conventional power stage layout 400. In this case, conventional power stage 401 is not vertically integrated; and it includes power ground (PGND) area 402 and input voltage (VIN) area 403. Inductor component 406 is coupled to conventional power stage 401 and it includes two terminals switching node (SW) area 404 and output voltage area 405. In contrast, FIG. 5 illustrates a vertically-integrated power stage layout 500, according to some embodiments. Power stage 100 includes power ground (PGND) area 502 and input voltage (VIN) area 503. Inductor component 506 is coupled to power stage 100 and it includes two terminals switching node (SW) area 504 and output voltage area 505.

In contrast with conventional layout 400, layout 500 has input voltage (VIN) area 503 and switching node (SW) area 504 spanning from left to right of power stage 100; which enables power and capacitance sharing across different phases. In terms of density comparison, layout 500 is smaller than layout 400 (e.g., 8.9 mm to 5.1 mm in the X direction), and power density is increased by approximately 38%.

Figure 6:
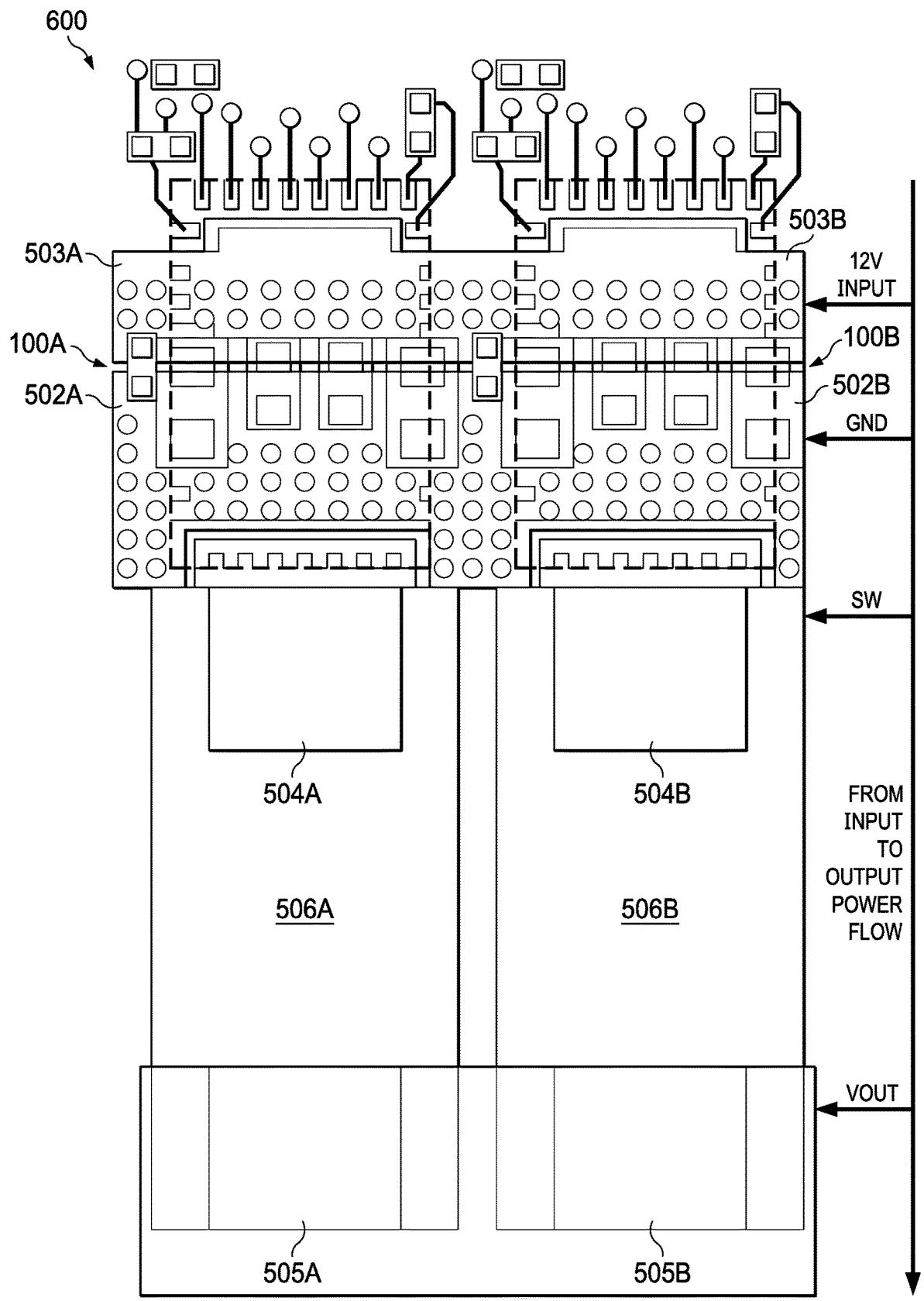
FIG. 6 illustrates power and capacitor sharing between vertically-integrated power stages, according to some embodiments.

FIG. 6 illustrates layout 600 with power and capacitor sharing between vertically-integrated power stages. In some embodiments, a multi-phase VR layout 600 may include a plurality of power stages 100A/100B disposed next to each other, such that power stages 100A/B share common input power (via input voltage (VIN) areas 503A/B), ground GND (via power ground (PGND) areas 502A/B), and regulated output (Vout) (via inductor output voltage areas 505A/B).

In various cases, by using VR layout 600, a smooth input to output flow results because the input $V_{in}$ via and the PGND via are well shared between phases 100A/B. In some cases, in addition to vertically integrated capacitors, each phase may have external capacitors mounted on the outside of the package. As such, a CPU VR layout with 7 phases may support up to 400 A peak current, and a 10 phase CPU VR layout with the same or even smaller PCB area as conventional devices, may be used to support up to 550 A peak current.

Moreover, VR layout 600 may be placed about 10 mm closer to the CPU, which reduces power losses and saves PCB area (e.g., 35% or more). Noise injection to the board and oscillation (OSC) spikes can be significantly reduced due to a shorter input to ground, decoupling the loop path with integrated decoupling capacitors. There is also better power via and decoupling capacitor sharing, with smooth power flow from input to output and between phases.

In contrast with conventional layouts, in VR layout 600 noises may be bypassed by the integrated decoupling capacitors within the 12V vias' feed input power. Improved efficiency and thermal performance can be achieved due to large input Vin and PGND thermal pads, which help reduce electrical and thermal impedance from device to PCB board. As such, VR layout 600 with vertically-integrated power stages enable high-density low-noise VR designs with higher power density, reduced or minimized X-Y dimensions, and/or optimized pinout.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An Information Handling System (IHS), comprising:
a processor;
a multi-phase voltage regulator (VR) coupled to the processor, wherein the multi-phase VR comprises at least one power stage, and wherein the at least one power stage comprises, integrated in a Power Quad Flat No Leads (PQFN) package:
   a High-Side Field-Effect Transistor (HSFET) die mounted on a leadframe;
   a Low-Side FET (LSFET) die mounted on the leadframe;
   at least one decoupling capacitor mounted on the leadframe;
   a driver circuit mounted on a clip, wherein the clip overlays at least a portion of the HSFET die and the LSFET die; and
a VR controller coupled to the at least one power stage, wherein the VR controller is coupled to a first pin of the PQFN package, and wherein the first pin is configured to:
   receive a current reference from the VR controller;
   provide the VR controller with an identification of a supplier of the power stage with a selected voltage level;
   provide the VR controller with access to an HSFET gate terminal; and
   enable communications during operation of the power stage.

2. The IHS of claim 1, wherein the at least one decoupling capacitor comprises a Multilayer Ceramic Capacitor (MLCC).

3. The IHS of claim 1, wherein the clip comprises a trace configured to couple a source terminal of the HSFET die to a drain terminal of the LSFET die to form a phase node.

4. The IHS of claim 1, wherein the clip covers the LSFET die and the HSFET die to the exclusion of the decoupling capacitor.

5. The IHS of claim 1, wherein the VR controller is coupled to a second pin of the PQFN package, and wherein the second pin is configured to:
  enable temperature sensing by the VR controller; and
  provide a fault warning to the VR controller.

6. The IHS of claim 1, wherein the multi-phase VR further comprises a plurality of power stages disposed next to each other, wherein the power stages share a common power via and decoupling capacitors.

7. A multi-phase voltage regulator (VR), comprising:
  a VR controller; and
  at least one power stage coupled to the VR controller, wherein the at least one power stage comprises:
    a High-Side Field-Effect Transistor (HSFET) die mounted on a leadframe;
    a Low-Side FET (LSFET) die mounted on the leadframe;
    a decoupling capacitor mounted on the leadframe; and
    a driver circuit mounted on a clip, wherein the clip overlays at least a portion of the HSFET die and the LSFET die to the exclusion of the decoupling capacitor, wherein the HSFET die, the LSFET die, the decoupling capacitor, and the driver circuit are integrated in a package, wherein the VR controller is coupled to a first pin of the package, and wherein the first pin is configured to:
  provide the VR controller with an identification of the power stage;
  provide the VR controller with access to an HSFET gate terminal; and
  enable communications during operation of the power stage.

8. The multi-phase VR of claim 7, wherein the VR controller is coupled to a third pin of the PQFN package, and wherein the third pin is configured to:
  enable temperature sensing by the VR controller; and
  provide a fault warning to the VR controller.

9. The multi-phase VR of claim 7, wherein the VR controller is coupled to a second pin of the PQFN package, and wherein the second pin is configured to:
  receive a current reference from the VR controller; and
  enable communications before operation of the power stage.

10. The multi-phase VR of claim 7, wherein the decoupling capacitor comprises a Multilayer Ceramic Capacitor (MLCC).

11. The multi-phase VR of claim 7, wherein the clip comprises a trace configured to couple a source terminal of the HSFET die to a drain terminal of the LSFET die to form a phase node.

12. A power stage of a voltage regulator (VR), the power stage comprising:
  a High-Side Field-Effect Transistor (HSFET) die mounted on a leadframe;
  a Low-Side FET (LSFET) die mounted on the leadframe;
  a decoupling capacitor mounted on the leadframe; and
  a driver circuit mounted on a clip, wherein the clip overlays at least a portion of the HSFET die and the LSFET die to the exclusion of the decoupling capacitor, wherein the HSFET die, the LSFET die, the decoupling capacitor, and the driver circuit are integrated in a package, and wherein the package comprises:
  a first pin configured to: provide an identification of the power stage, provide access to an HSFET gate terminal, and enable communications during operation of the power stage, and
  a second pin configured to receive a current reference.

13. The power stage of claim 12, wherein the package comprises a third pin configured to:
  enable temperature sensing; and
  provide a fault warning to the VR controller.

* * * * *